United States Patent [19]
Pascucci

[11] Patent Number: 5,917,768
[45] Date of Patent: Jun. 29, 1999

[54] MEMORY ARCHITECTURE FOR FLEXIBLE READING MANAGEMENT, PARTICULARLY FOR NON-VOLATILE MEMORIES, HAVING NOISE-IMMUNITY FEATURES, MATCHING DEVICE PERFORMANCE, AND HAVING OPTIMIZED THROUGHOUT

[75] Inventor: Luigi Pascucci, Sesto San Giovanni, Italy

[73] Assignee: SGS-Thomson Microelectronics S.r.L., Agrate Brianza, Italy

[21] Appl. No.: 08/847,385

[22] Filed: Apr. 24, 1997

[51] Int. Cl.$^6$ ..................................................... G11C 7/02
[52] U.S. Cl. ......................... 365/210; 365/233; 365/233.5
[58] Field of Search .................................. 365/210, 233, 365/233.5

[56] References Cited

U.S. PATENT DOCUMENTS

| | | | |
|---|---|---|---|
| 5,371,716 | 12/1994 | Yamanaka | 365/233.5 |
| 5,592,434 | 1/1997 | Iwamoto et al. | 365/233 |
| 5,694,369 | 12/1997 | Abe | 365/210 |

FOREIGN PATENT DOCUMENTS

| | | | |
|---|---|---|---|
| A-0 186 906 | 7/1986 | European Pat. Off. | G11C 7/00 |
| A-0 301 603 | 2/1989 | European Pat. Off. | G11C 7/00 |
| A-0 473 127 | 3/1992 | European Pat. Off. | G11C 7/00 |
| A-0 526 433 | 2/1993 | European Pat. Off. | G11C 7/00 |
| A-2 261 089 | 5/1993 | United Kingdom | G11C 7/00 |

*Primary Examiner*—David Nelms
*Assistant Examiner*—Hoai V. Ho
*Attorney, Agent, or Firm*—Wolf, Greenfield & Sacks, P.C.

[57] ABSTRACT

A memory device for flexible reading management, particularly for non-volatile memories, including at least one memory matrix; at least one sense amplifier for capturing data from the at least one memory matrix; at least one output buffer for providing the data as an output, connected to the sense amplifier by an internal bus; at least one row decoder for selecting the word lines of the memory matrix; a memory read address transition detection circuit adapted to produce an address transition signal; a circuit for enabling/disabling the read circuits; a circuit for enabling a reading process, adapted to enable the reading process only after the minimum functionality levels of the memory cells involved in the reading process and of all the connected read circuits have been reached; a propagation reproduction circuit; a network for equalizing and correlating the reading with respect to the characteristics of the circuits, signal propagations, and conductivity of the memory cells; a reading cycle end circuit adapted to determine the end of the reading process; and a circuit for synchronized and time-limited loading of the data in the at least one output buffer.

20 Claims, 7 Drawing Sheets

MEMORY ARCHITECTURE FOR FLEXIBLE READING MANAGEMENT, PARTICULARLY FOR NON-VOLATILE MEMORIES, HAVING NOISE-IMMUNITY FEATURES, MATCHING DEVICE PERFORMANCE, AND HAVING OPTIMIZED THROUGHOUT

BACKGROUND OF THE INVENTION

1. Field of the Invention

The present invention relates to a memory architecture for flexible reading management, particularly for non-volatile memories, having noise-immunity features, matching device performance, and having optimized throughput. In particular, the invention relates to a method and a memory circuit capable of ensuring correct reading of the memory with improved performance with respect to conventional methods and circuits.

2. Discussion of the Related Art

In fast parallel memories, one of the most challenging problems is the error of a generic read operation caused by any source of noise, whether internal to the memory device or caused by the memory itself during the switching of its output buffers.

This problem worsens as the degree of parallelism (x8, x16, x32, . . . ) increases and as the required transition speed rises.

Switchings on the outputs, in addition to generating intense noise on the internal circuits of the memory, generally slow down the reading times; the less synchronously this event occurs and the greater the number of outputs, the greater the slowing effect.

Accordingly, memories with a plurality of outputs are vulnerable to noise, and it is difficult to improve their speed performance.

A possible answer to this problem is a design approach with so-called time-controlled architectures, in which a time is set during which reading must be performed.

However, this solution has further problems. First of all, there is the drawback of the difficulty in achieving correct reading at power supply start-up, i.e., when the power supply has not yet reached its steady-state value.

In a time-controlled or sampled system, once a reading operation has been performed, it cannot be changed until the next reading operation occurs.

Furthermore, this second type of memory architecture does not have the necessary features of flexibility and adaptability to the various conditions of the devices of the memory and to the different power supply conditions. The adoption of a rigid architecture does not combine well with the indispensable requirement of matching the conditions and properties of the devices and circuits and with the need to optimize the reading speed in every circumstance while preserving its correctness.

This entails the need to determine preset delays to ensure reading correctness; these delays must also be long enough to be sure of having correct reading in all possible operating situations and with devices having different characteristics; however, the problem of first reading is still not solved.

The lack of flexibility and adaptability makes it difficult to use these architectures if the technology used in the memory changes, unless one radically modifies the circuital structure of the architecture to adapt to the new requirements.

Further drawbacks are caused by the consumption of the memory circuits and by reliability problems, caused by the fact that the read circuits are constantly biased.

SUMMARY OF THE INVENTION

An object of the present invention is to provide a memory architecture for flexible reading management, particularly for non-volatile memories, that provides a memory read path management that is controlled digitally and is synchronized in its natural development.

Another object of the present invention is to provide a memory architecture for flexible reading management, particularly for non-volatile memories, that flexibly links reading to the characteristics of the devices used, to the various temperature and power supply conditions that occur, and to the state of the technology.

Another object of the present invention is to provide a memory architecture for flexible reading management that ensures correlation of the reading timing with the propagation conditions of the word lines and of the bit lines.

Another object of the present invention is to provide a memory architecture for flexible reading management, particularly for non-volatile memories, that performs correct reading in assured conditions from the very start, even during power supply start-up.

Another object of the present invention is to provide a memory architecture for flexible reading management, particularly for non-volatile memories, that minimizes memory consumption.

Another object of the present invention is to provide a memory architecture for flexible reading management, particularly for non-volatile memories, that immediately presets, after the end of a reading operation, the initial conditions, disabling all word lines and eliminating any consumption linked to the reading structures.

Another object of the present invention is to provide a memory architecture for flexible reading management, particularly for non-volatile memories, that interrupts any consumption from the boost line.

Another object of the present invention is to provide a memory architecture for flexible reading management, particularly for non-volatile memories, that reduces the output buffer switching time.

Another object of the present invention is to provide a memory architecture for flexible reading management, particularly for non-volatile memories, that eliminates false readings and allows a substantial filtering of noise, so as to always correctly read the data contained in the memory.

Another object of the present invention is to provide a memory architecture for flexible reading management, particularly for non-volatile memories, that handles in a time-controlled manner the various events that form a reading step, so as to synchronize their occurrence.

Another object of the present invention is to provide a memory architecture for flexible reading management, particularly for non-volatile memories, that controls boost circuits, if provided.

Another object of the present invention is to provide a memory architecture for flexible reading management, particularly for non-volatile memories, that provides the possibility of selecting byte-type or word-type reading mode.

Another object of the present invention is to provide a memory architecture for flexible reading management, particularly for non-volatile memories, that disables any static biasing conditions within the matrix of the memory device.

Another object of the present invention is to provide a memory architecture that is highly reliable, relatively easy to manufacture, and at competitive costs.

An embodiment of the invention is directed to a memory circuit for flexible reading management, particularly for non-volatile memories, including at least one memory matrix; at least one sense amplifier for capturing the data from the at least one memory matrix; at least one output buffer for providing the read data in output, the output buffer being connected to the sense amplifier by means of an internal bus; and at least one row decoder for selecting the word lines of the memory matrix. The memory circuit further includes

- a memory read address transition detection circuit, adapted to produce an address transition signal;
- a circuit for enabling/disabling the read circuits;
- a circuit for enabling the reading process, adapted to enable reading only after the minimum functionality levels of the memory cells involved in the reading operation and of all the connected read circuits have been reached;
- a network for equalizing and correlating the reading with respect to the characteristics of the devices, the signal propagations, and the conductivity of the memory cells, the propagations being detected by a propagation reproduction circuit;
- a reading cycle end circuit, adapted to determine the end of the reading process by deactivating the row decoder following the capture of the read data item in the sense amplifier; and
- a circuit for the synchronized and time-limited loading of the data in the at least one output buffer, the output buffer having a memory structure and being normally disconnected from the internal circuits, the enabling of the reading process being performed in close correlation with the intrinsic characteristics of the read circuits and of the memory cells.

Another embodiment of the invention is directed to a method for reading data of a memory device, particularly of the non-volatile type, that includes at least one memory matrix; at least one sense amplifier for capturing the data from the at least one memory matrix; at least one output buffer for providing the read data in output, the buffer being connected to the sense amplifier by means of an internal bus; and at least one row decoder for selecting the word lines of said memory matrix. The method includes the steps of

- selecting a row of the memory matrix that corresponds to a read address and generating a read address transition detection signal for the synchronization of the read circuits;
- determining when the conditions of minimum functionality for the read circuits, for the memory cells to be read, and for the supply voltage are attained;
- enabling the read circuits exclusively for the reading step;
- capturing the data of the memory matrix in the at least one sense amplifier; and
- sending said data to the at least one output buffer, synchronously with the arrival of the data, to provide them on an output.

BRIEF DESCRIPTION OF THE DRAWINGS

Further characteristics and advantages of the invention will become apparent from the description of a preferred but not exclusive embodiment of the device according to the invention, illustrated only by way of non-limitative example in the accompanying drawings, wherein.

DETAILED DESCRIPTION

Figure 1:
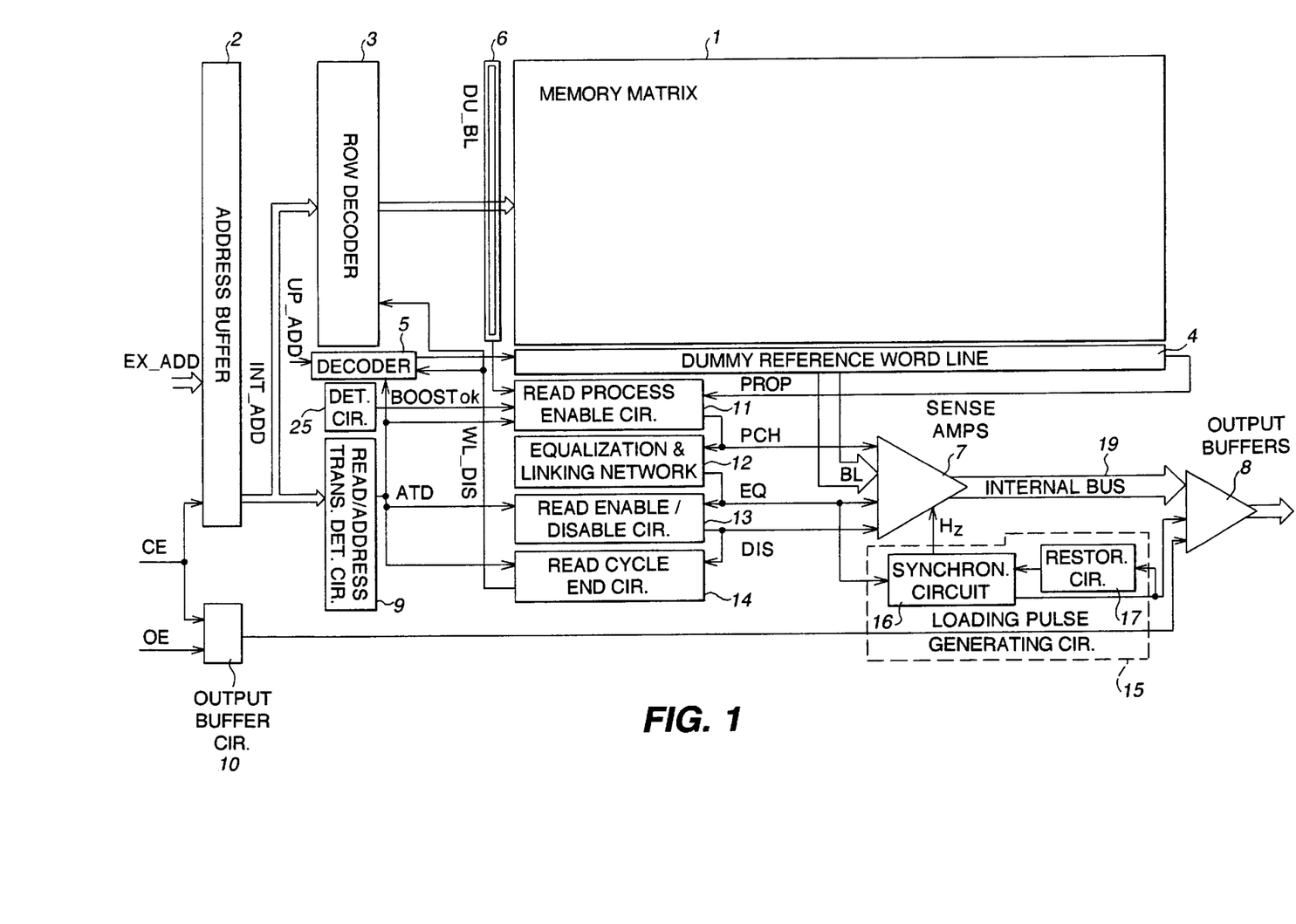
FIG. 1 is a block diagram of the memory device according to the invention, in the case of a single memory matrix.
Figure 2:
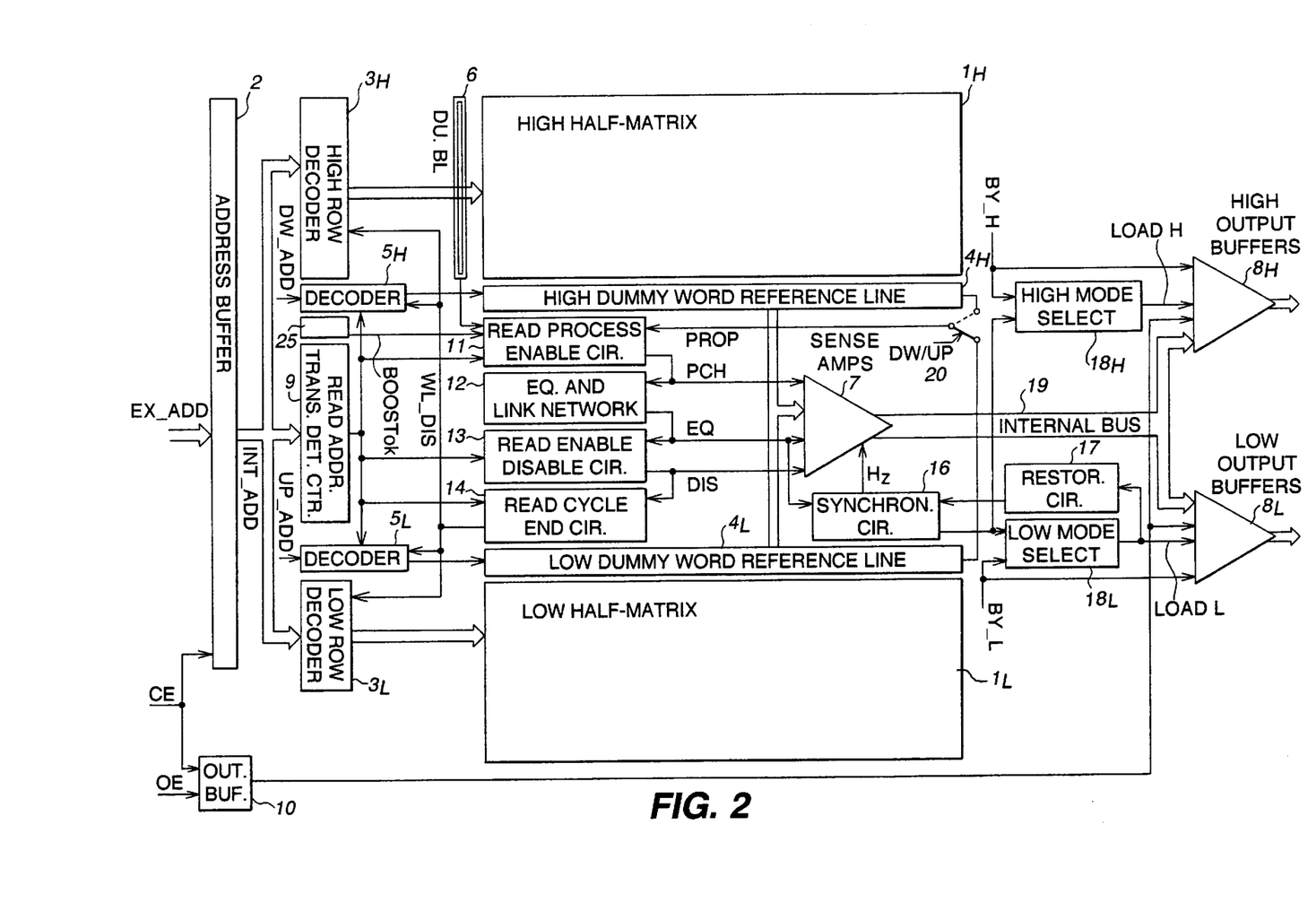
FIG. 2 is a block diagram of the memory device according to the invention, in the case of a memory provided with two memory matrices.

With reference to the above figures, and particularly initially to FIGS. 1 and 2, the architecture according to the invention includes at least one memory matrix 1, which is divided into a plurality of word lines and bit lines and is provided with a dummy reference word line 4 to reproduce propagation along a generic word line; an address buffer 2, which receives on an input the read addresses carried by an external address bus EX-ADD; a row decoder 3 for selecting a row of the memory matrix 1 and a decoder 5 for stimulating propagation along the dummy word line 4, driven by a signal designated by UP-ADD; a dummy bit line 6 to reproduce the pre-charge over a generic bit line of the matrix 1; a plurality of sense amplifiers 7 (one for each bit of the memory matrix: in case of an 8-bit memory, therefore, eight sense amplifiers plus one for the redundancy lines) to capture the data from the matrix 1; a plurality of output buffers 8, whose number is equal to the number of sense amplifiers 7; and reading timing control circuits that will be described in detail hereinafter.

Each one of the output buffers 8 is provided with a memory structure that disconnects them from the rest of the circuit and updates their content only at the end of a complete reading operation, thus preventing any unwanted propagation induced by noise.

Thanks to substantial noise-immunity, the output buffers 8 are provided with much larger physical dimensions than the output buffers of conventional architecture, with a considerable reduction of switching times, consequently providing faster reading.

The address buffer 2 is connected, by means of an internal address bus INT-ADD, to the row decoder 3 and to a circuit 9 for generating a pulsed signal ATD (Address Transition Detection) for detecting the transition of a read address of the memory matrix 1.

The decoder 5, the dummy bit line 6, and the dummy word line 4 form a propagation reproduction structure that when stimulated at the end of the pulse of the ATD signal repeats the propagation of the word line and of the bit line that have actually been selected, in order to assuredly and synchronously determine the timing with which a successful reading operation of the memory device must be triggered.

The row decoder 3 is advantageously formed, for example, by a decoder of the hierarchical type.

A circuit 10 for activating the output buffers 8 receives on an input a memory device enable signal CE, which is also sent on an input to the address buffer 2, and an output enable signal OE to activate the output buffers 8 only at the end of a completed reading cycle, thus reducing, from the very first reading cycle, the possibility of generating noise and therefore preventing the consequent increase in the access time of a first reading cycle.

The output activation circuit 10 is described in European patent application No. 94830538.8, which is hereby incorporated by reference.

The sense amplifiers 7 are connected to the output buffers 8 by means of an internal bus 19 for the output transfer of the data captured by the memory matrix 1.

The internal bus 19 is described in detail in European patent application no. 96830128.3, European patent application no. 96830129.1, and European patent application no. 96830127.5, which are hereby incorporated by reference.

The above mentioned read timing control circuits include in addition to the circuit 9 for generating the signal ATD:

- a set of circuits, generally designated by the reference numeral 11 and shown merely in block form, adapted to enable a process for reading the memory matrix 1 only when the minimum functionality levels of the memory cells involved in the reading operation and of all the connected read circuits have been reached. These circuits 11 ensure correct reading even during power supply transitions, i.e., when the power supply has not yet reached its steady-state value;
- an equalization and linking network 12, adapted to equalize the bit lines involved in the reading operation and to link the equalization to the characteristics of the memory devices and to the supply conditions. The network 12 makes the reading cycle flexible, adapting it, without any reconfiguration, to the different operating conditions (low voltage, boost voltage, etc.), to the real conductivity of the matrix cells, and to the propagations of the signals. The network 12 emits on an output an equalization signal EQ that is sent on an input to a circuit 13 for enabling/disabling the read circuits and to the sense amplifiers 7;
- a circuit 13 for enabling/disabling the read circuits, which enables the read circuits only at the end of the pulse of ATD and exclusively for the time required for reading, thus limiting the consumption of the memory device to this single step; and
- a cycle end circuit 14 and a line WL_dis for deactivating/activating the row decoding performed by the row decoder 3 and the decoding of the decoder 5. The circuit 14 enables the row decoder 3 synchronously with the arrival of the pulsed signal of ATD and determines its deactivation upon capture of the data item read in the corresponding sense amplifier 7 in parallel to the transfer of the data item on the corresponding output buffer 8; in this manner, one eliminates any possible consumption due to decoding, avoids maintaining useless biasings of the cells of the matrix 1, and eliminates the consumptions related to the row decoder 3, which mainly involve the boost structure.

The circuit 13 thus emits a signal DIS that is sent to the sense amplifiers 7 and to the cycle end circuit 14. The read timing control circuits further include

- a loading pulse generating circuit 15 (not shown in detail, described in European patent application no. 96830169.7 which is hereby incorporated by reference) for the synchronized loading of the data in the output buffers 8, the duration of the loading operation being limited to the time interval that is sufficient for the transit and capture of the data in the memory structure of the output buffers 8.

The circuits 11, 13, and 14 are driven by the signal ATD; i.e., their operation is synchronized with the falling edge of the signal ATD.

In greater detail, the circuits 11 include a structure (not shown) for reproducing the operating conditions within the memory matrix; the structure including:

- a circuit for reproducing the propagations along a generic word line (not shown, but described in European patent application no. 96830160.6 and hereby incorporated by reference);
- a circuit for reproducing the selection/deselection and pre-charge delays of a generic bit line (not shown in detail, but described in European patent application no. 96830197.8 and hereby incorporated by reference); and
- a circuit for determining when the working point of the bit line involved in the reading operation is attained (not shown, but described in European patent application no. 96830197.8 and hereby incorporated by reference).

The circuit for reproducing the propagations along a generic word line produces the signal PROP, which is used, together with a signal for reproducing the selection/deselection and pre-charge delays of the bit line, to generate a signal that is adapted to interrupt the pre-charge of the bit line so as to closely match the attainment of the minimum-functionality conditions of the memory cells and of the read circuits.

If the minimum-functionality conditions are not reached, the system remains in pre-charge mode until the conditions occur.

The circuit for determining working point attainment produces the pre-charge step interruption signal to proceeds with data reading. This signal is referenced by PCH_RES in FIG. 5.

The circuits 11 also include a circuit (not shown in detail) for generating a power-on reset signal (POR signal), which includes a memory cell that is fully identical to a generic memory cell of the memory matrix 1. The circuit for generating the signal POR is correlated to the minimum detectable conductivity level reached by the reference memory cell and therefore triggers reading timing only when the POR signal becomes low.

The circuit for generating the POR signal is described in detail in European patent application no. 96830046.7 which is hereby incorporated by reference.

The circuits 11 also include a memory circuit for the pre-charge step (shown in detail in FIG. 5) that is adapted to determine, at the onset of the minimum-functionality conditions, the end of the pre-charge step to perform a first correct reading of the memory cells in assured conditions. The signal emitted by the memory circuit for the pre-charge step is referenced by PCHn in FIG. 5.

The circuits 11 then emit a pre-charge signal PCH that is sent to the equalization and linking network 12, to modulate the delay and duration of the subsequent equalization step in close correlation with the conductivity of a reference memory cell that is fully identical to a memory cell of the memory matrix 1.

The time interval of the equalization step is also flexible, depending on the conductivity characteristics of the non-volatile elements (memory cells), on their biasing conditions, and on the temperature.

The pre-charge signal PCH is also sent to the sense amplifiers 7.

The equalization and linking network 12 is described in European patent application no. 96830165.5, which is in turn correlated with European patent application no. 96830168.9.

The operation of the circuits 11 is correlated with the power supply conditions that are currently present in the memory device, i.e., a voltage $V_{DD}$ or a boost voltage.

The linking to the supply voltage determines a minimum pre-charge interval that matches the supply voltage that is actually present; in this manner, the reading timing is determined flexibly, without altering the configuration of the read circuits if the operating conditions or the technology changes.

If a boost voltage is present, the reading timing, in its first cycle, if it has started in a transient step, must be slowed down in order to allow the boost voltage to reach the preset minimum level. If this does not occur, use of the boost voltage would be useless.

For this purpose, there is a circuit 25 (not shown in detail) for determining when a threshold voltage is reached by the boost voltage; the circuit 25 emits on an output a signal BOOSTok adapted to trigger the reading process. The signal BOOSTok is sent on an input to the circuits 11.

Thus, the pre-charge step is synchronized with the attainment of the minimum detectable conductivity conditions.

Figure 4:
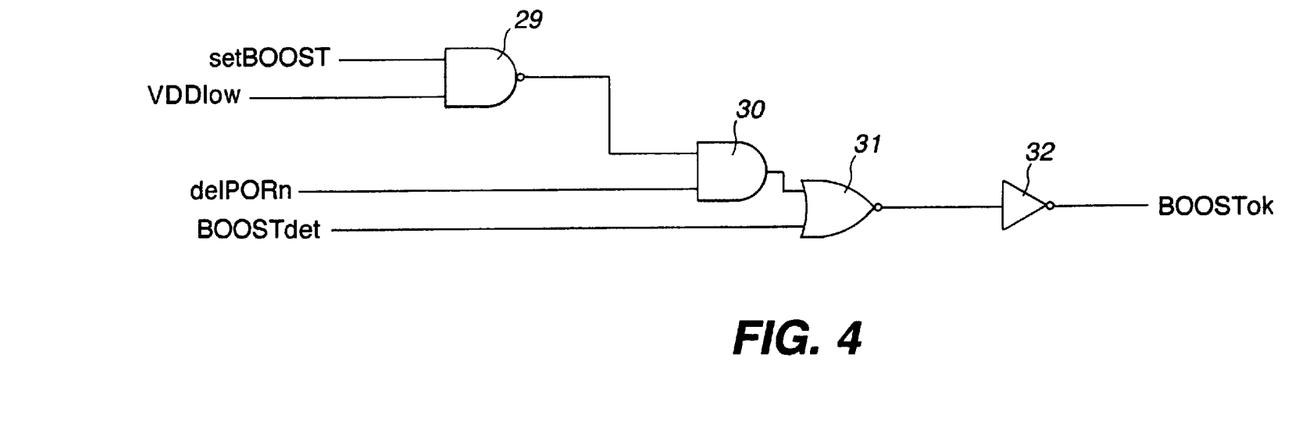
FIG. 4 is a circuit diagram of a portion of the device shown in the block diagrams of FIGS. 1 and 2.

The circuit 25 for determining when the boost voltage reaches a threshold voltage is described in European patent application no. 9583030360.4 and is hereby incorporated by reference. FIG. 4 illustrates a logic circuit that receives on an input a signal setBOOST indicating the presence of the boost voltage and the signal BOOSTdet that indicates that the threshold for the boost voltage has been exceeded, in order to emit the signal BOOSTok in output.

This circuit determines, by virtue of a comparison with a substantially constant reference voltage, whether the voltage to be monitored, in this case the boost voltage, which can vary between a first value and a second value, exceeds a preset threshold. This evaluation is performed by subtraction between the reference voltage and the voltage to be monitored.

If the signal setBOOST is low, then the function is disabled and the signal BOOSTok is produced, with an appropriate delay, at the end of the POR signal, by virtue of delPORn.

The circuit 15 for the synchronized loading of the data in the output buffers 8 includes a circuit 16 for generating a signal Hz and a signal for loading the data in the output buffers 8 (the circuit is shown in detail in FIG. 3) and a circuit 17 for restoring the signal Hz.

FIG. 2 shows the memory architecture according to the invention, in the case in which the memory matrix 1 is split into two half-matrices, designated respectively by $1_H$ and $1_L$.

In FIG. 2, the elements that correspond to the ones present in FIG. 1 are designated by the same reference numerals. In order to distinguish the elements provided for the half-matrix $1_H$ and for the half-matrix $1_L$, the reference numerals are given a suffix "H" or "L" that indicates that the designated element relates to one or the other of the two half-matrices.

FIG. 2 shows that only one dummy bit line 6 is still provided even in the case of two half-matrices $1_H$ and $1_L$.

With reference to the decoder 5, there are two decoders $5_H$ and $5_L$, driven respectively by a signal DW_ADD and by a signal UP_ADD. The decoder $5_H$ stimulates the dummy word line $4_H$ when a read address is produced for the opposite half-matrix, i.e., the half-matrix $1_L$. The dummy word line $4_L$ is stimulated in the opposite case.

Selection of one or the other of the dummy word lines $4_H$ and $4_L$ is determined by a signal DW/UP that indicates stimulation of the line $4_H$ or of the line $4_L$. The signal DW/UP acts on a switch 20.

The data loading circuit 15 shown in FIG. 1 also includes, in the case of the two half-matrices of FIG. 2, circuits $18_L$, $18_H$ for selecting the byte or word reading mode. These circuits allow to select the synchronized loading of data from one or the other of the memory half-matrices and are controlled respectively by the signals BY_L and BY_H.

Figure 3:
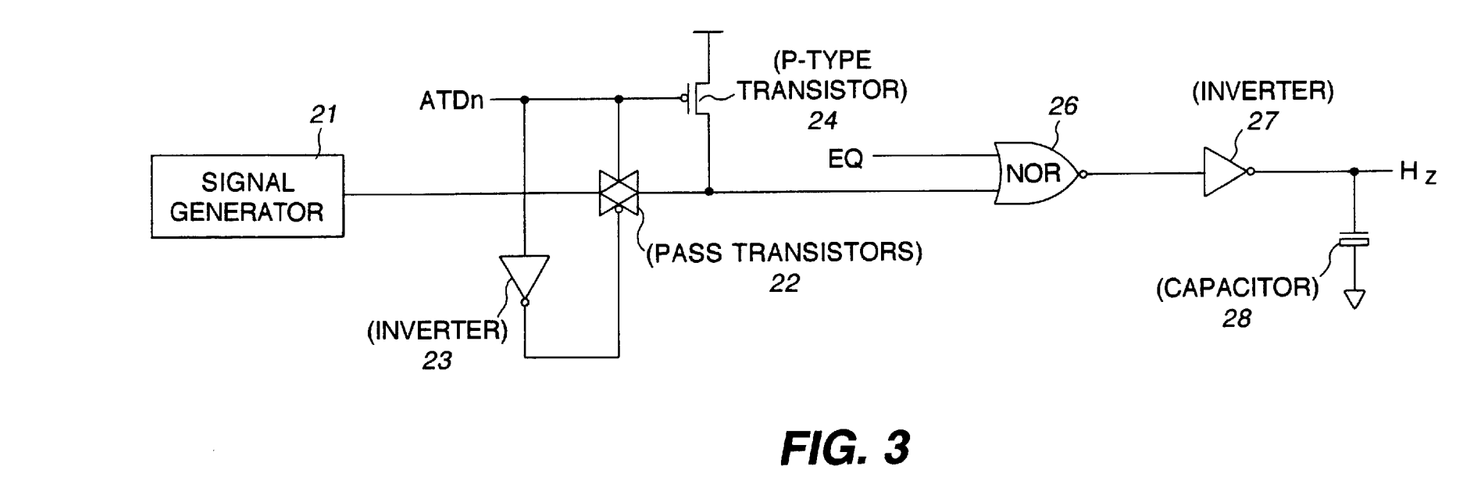
FIG. 3 is a circuit diagram of a portion of the device shown in the block diagrams of FIGS. 1 and 2.

FIG. 3 shows in detail a possible circuital implementation of a circuit for generating a synchronization signal Hz that is adapted to enable, when low, the loading of the data from the sense amplifier 7 on the internal bus 19, in correlation with the presence of the signal ATD and of the equalization signal EQ. The circuit includes means 21 for enabling the generation of the signal Hz that are output-connected to a pair of pass transistors 22 that is formed by a P-type transistor and by an N-type transistor.

The signal ATD generated by the circuit 9, appropriately inverted (ATDn), is sent on an input to the gate terminal of the N-type transistor of the two pass transistors 21 and is also sent in input, after passing through an inverter 23, to the gate terminal of the P-type transistor of the same pair 22 of pass transistors.

The signal ATDn is also sent on an input to a P-type transistor 24 that is interposed between the supply voltage and the output of the pair of pass transistors 22.

A NOR logic gate 26 receives on an input the output of the pair of pass transistors 22 and the equalization signal EQ.

An inverter 27 is cascade-connected to the NOR gate 26 and its output is discharged to the ground across a capacitor 28. The output of the inverter 27 is the signal Hz for enabling the loading of the data from the sense amplifier to the internal bus 19.

FIG. 4 shows, in circuital detail, the circuit for generating the signal BOOSTok. The circuit includes a first NAND gate that receives on an input the signal setBOOST, which indicates that a boost voltage is used, and the signal VDDlow, which indicates that the supply voltage used in the device is low (hence the need to use a boost voltage).

The output of the NAND gate 29 is sent on an input to an AND gate 30, whose other input receives by the signal delPORn. The output of the AND gate 30 is sent on an input to a NOR gate 31, whose other input receives by the signal BOOSTdet, which indicates that the boost voltage has reached the desired threshold level.

The output of the NOR gate 31 is sent in input to an inverter 32 whose output is the signal BOOSTok, which is adapted to trigger the reading process.

Figure 5:
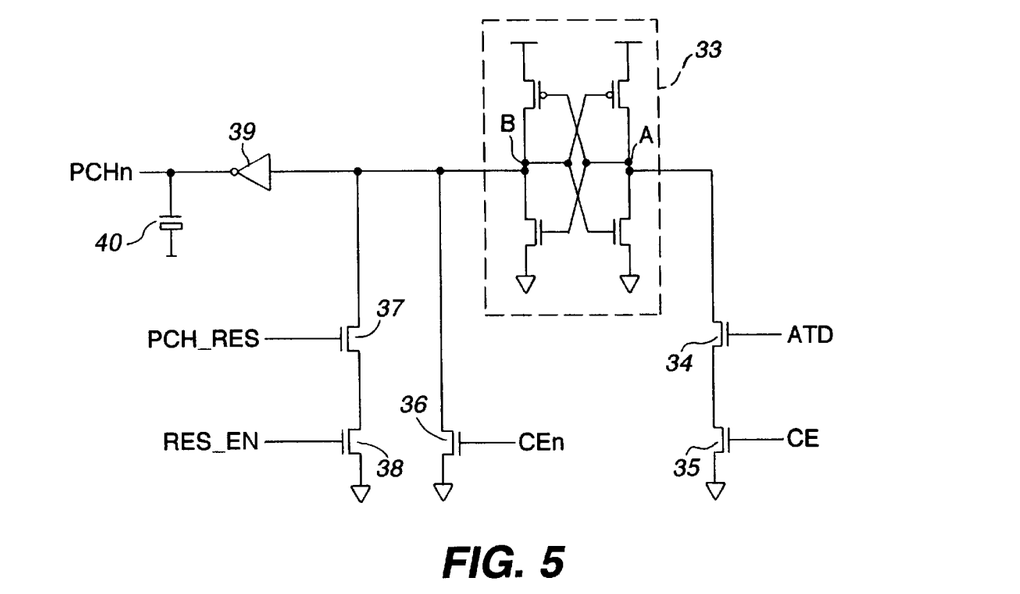
FIG. 5 is a circuit diagram of a portion of the device shown in the block diagrams of FIGS. 1 and 2.

FIG. 5 is a detail view of the memory circuit for the pre-charge step, defined in FIG. 1, together with other above described circuits, in the block designated by the reference numeral 11. The circuit includes a memory structure of the flip-flop type 33, which has an input node A and an output node B.

A first control branch is connected to the input node A and is formed by the series-connected N-channel transistors 34 and 35, which respectively receive, at their gate terminals, the signal ATD and the signal CE.

A second control branch is connected on an output to the output node B and is formed by the N-channel transistor 36, which receives the signal CEn as an input at the gate terminal.

A third control branch is parallel-connected to the second control branch and is formed by an N-channel transistor 37 and by an N-channel transistor 38 that are series-connected and respectively receive, at their gate terminals, the precharge step interruption signal PCH_RES and the signal RES_EN.

These two signals are generated by the circuits of the block 11 of FIG. 1.

An inverter 39 is cascade-connected to the third control branch, and its output is connected to the ground by means of a capacitor 40. The output of the inverter 39 is the signal PCHn, which determines the end of the pre-charge step to start a subsequent equalization step.

Figure 6:
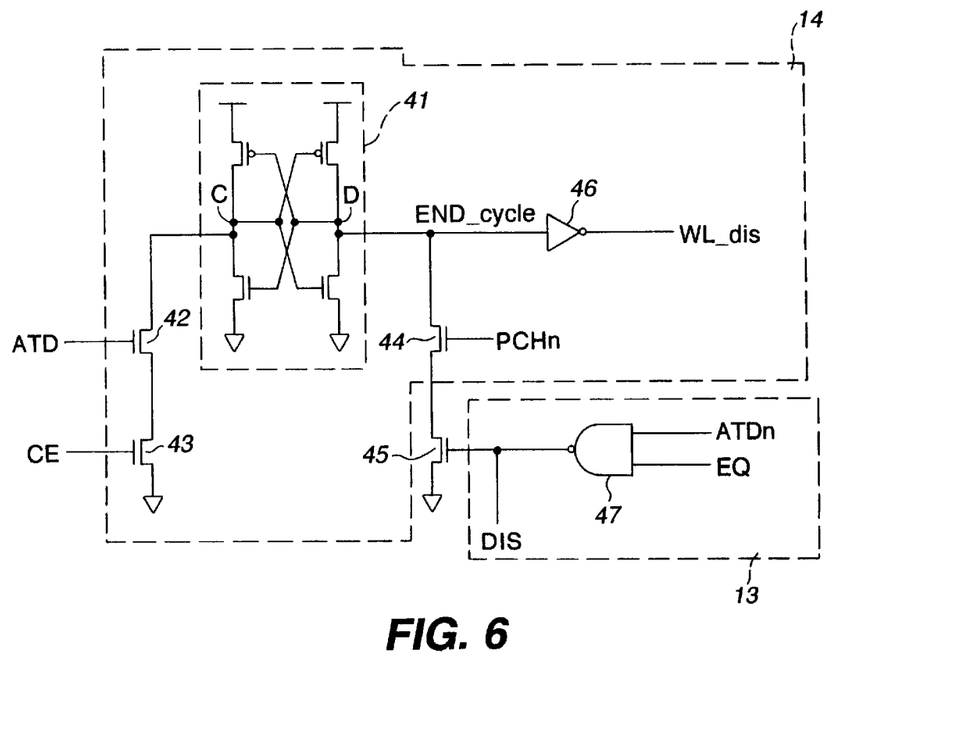
FIG. 6 is a circuit diagram of a portion of the device shown in the block diagram of FIGS. 1 and 2.

FIG. 6 illustrates, in its circuital details, the circuit 13 for enabling/disabling the read circuits, the read cycle end circuit 14, and the line WL_dis for deactivating/activating row decoding.

The circuit 14 includes a memory structure that is formed by a flip-flop 41 that has an input node C and an output node D.

A first circuit branch is connected to the node C and includes two series-connected N-channel transistors 42 and 43 that receive the signals ATD and CE, respectively, at their gate terminals.

A second circuit branch is connected to the output node D and is formed by two series-connected N-channel transistors 44 and 45 that receive on inputs to their gate terminals the signals PCHn (generated by the circuit of FIG. 5) and DIS (for enabling/disabling the read circuits) respectively. The signal DIS is generated by a NAND gate 47, whose inputs are the signals ATDn and EQ.

An inverter 46 is cascade-connected to the output node D and its output is the signal WL_dis for disabling the word line.

Figure 7:
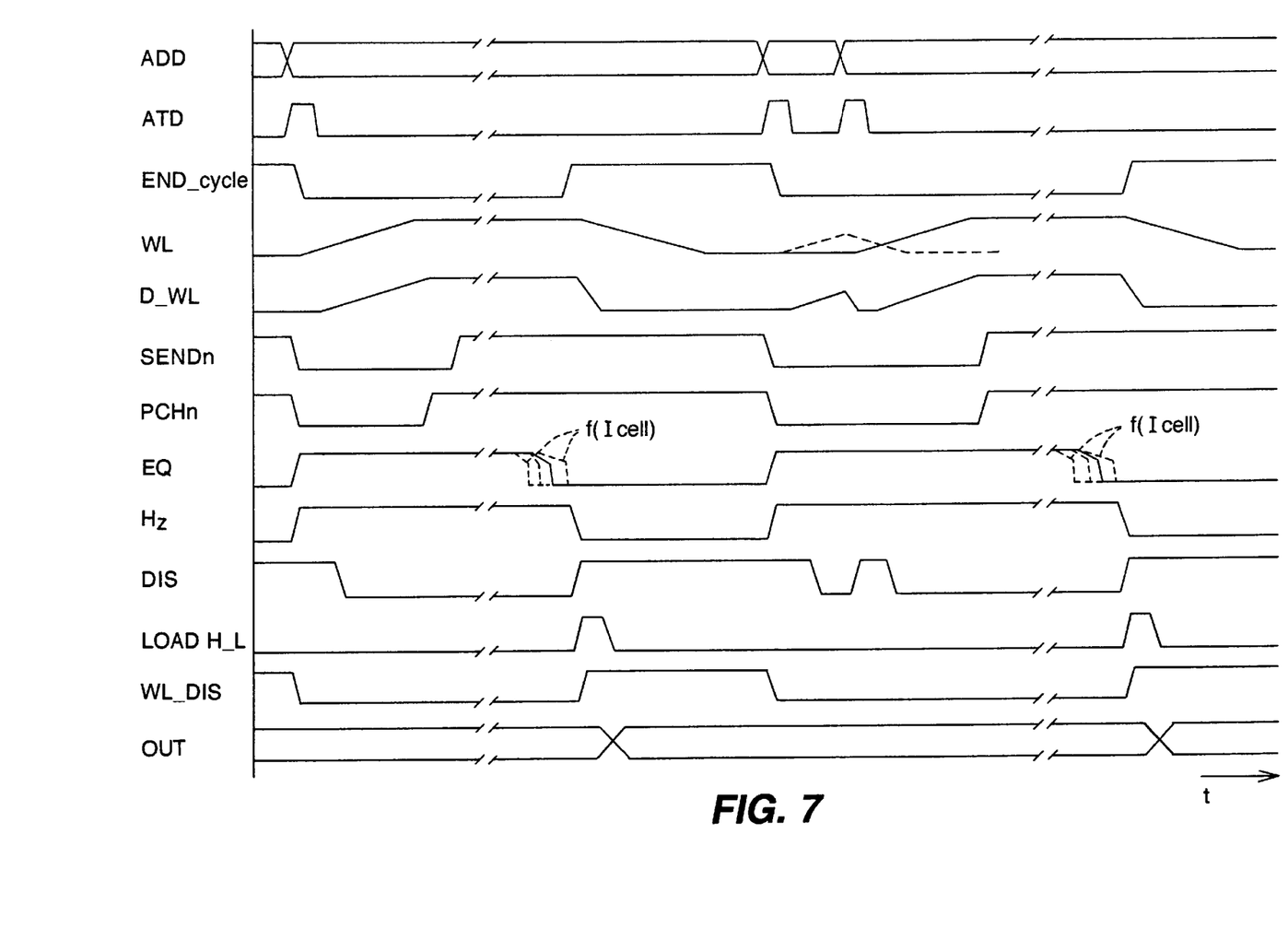
FIG. 7 is a chart of the timings of the various signals that are present in the memory device according to the invention.
Figure 8:
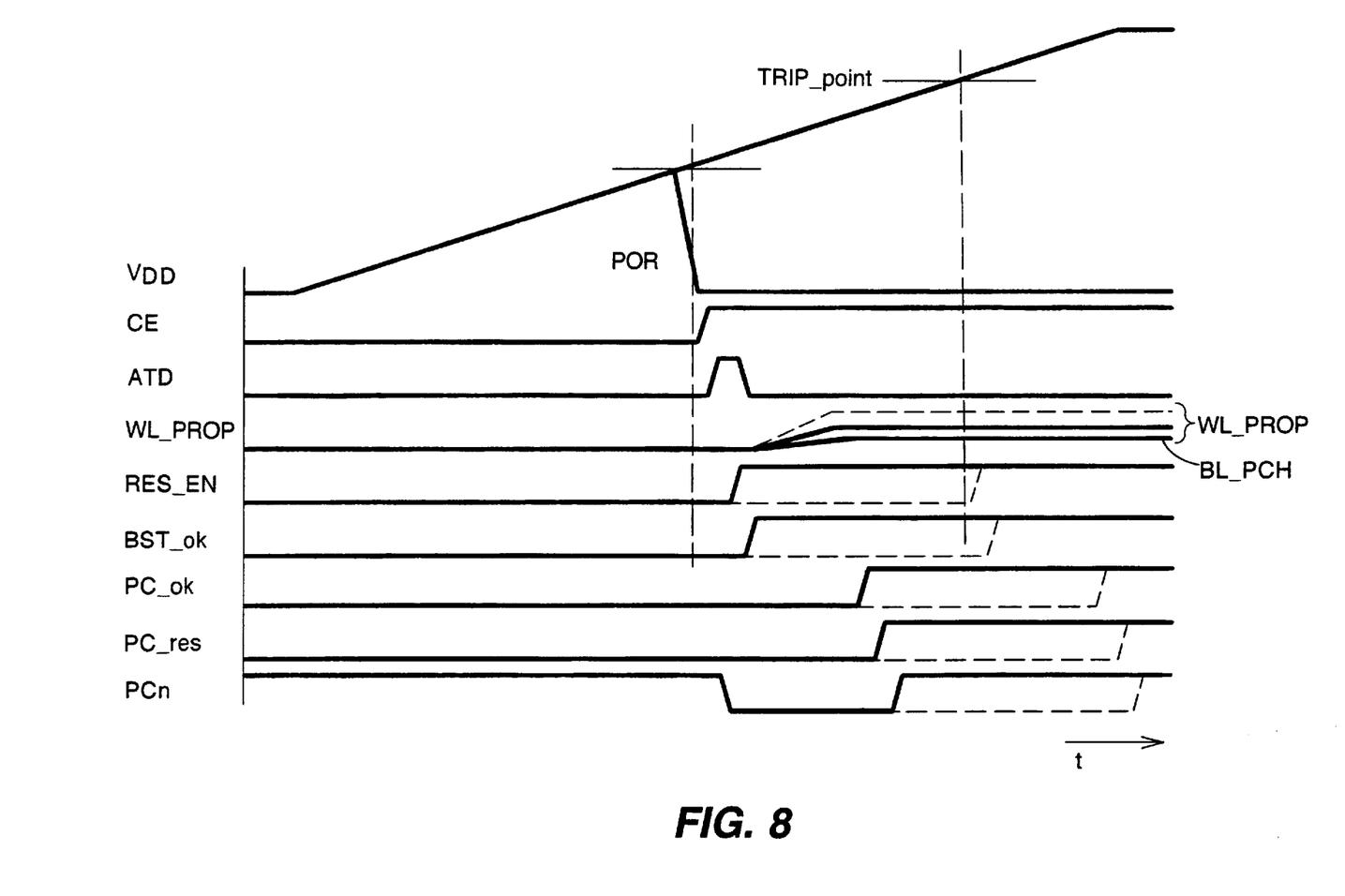
FIG. 8 is a chart of the timings of the various signals that are present in the device according to the invention, illustrating the correlation with the supply voltage in the absence of a boost voltage.
Figure 9:
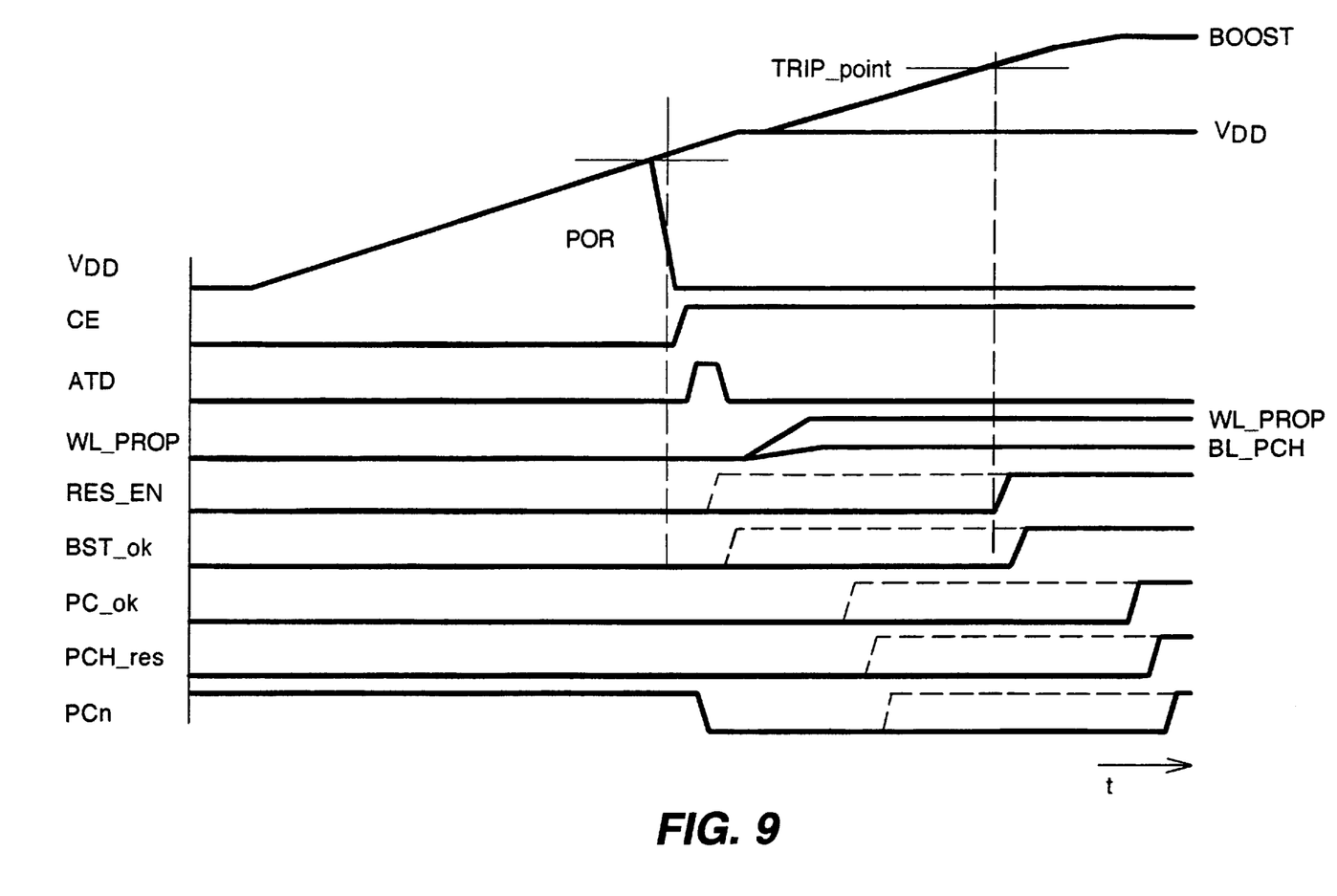
FIG. 9 is a chart of the timings of the various signals that are present in the device according to the invention, illustrating the correlation with the supply voltage in the presence of a boost voltage.

FIGS. 7, 8, and 9 are charts of the timings of the various signals that are present in the memory device and will be explained hereinafter with reference to the operation of the memory architecture according to the invention.

With reference to the above figures, the operation of the memory architecture according to the invention is as follows.

For the sake of simplicity, the operation of the architecture according to the invention will be explained in relation to the case of a single memory matrix, as shown in FIG. 1.

A signal CE (Chip Enable) for enabling the device enables the address buffer 2, and a memory read address is provided by the address bus EX_ADD to the address buffer 2 and is sent from there, by means of the bus INT_ADD, to the row decoder 3, which selects the word line addressed in the memory matrix 1.

When the output enable signal OE (Output Enable) is present, the enable signal CE also enables the enable circuit 10 of the output buffers 8. The signal OE is generated only at the end of a completed read cycle, thus limiting the possibility of generating noise that can alter the data in the output buffer 8, and therefore prevents extension of the access time of a first read cycle.

The read address is also sent to the circuit 9 for generating the address transition detection signal ATD, which synchronizes the operation of all the downstream read circuits, thus correlating all subsequent timings with the actual detection of the read address transition.

The correlation of the generation of the signal ATD with the transition of the address ADD is shown in the chart of FIG. 7, to which reference will be made hereinafter to show the development of the various signals of the memory device.

The signal END_cycle, in this step (at the end of the signal ATD), is low, so as to enable the row decoder 3.

The signal ATD is sent on inputs to the circuits 11, 13, and 14.

If a boost voltage is provided as a supply voltage for the memory device, the circuit 25 determines the attainment of a threshold voltage on the part of the boost voltage and emits on an output the signal BOOSTok for enabling memory reading.

The circuit 25 is shown in FIG. 4 (FIG. 4 does not show the circuit that is adapted to determine whether the boost voltage has exceeded the threshold voltage and emits on an output the signal BOOSTdet); in this figure, if the signal setBOOST that indicates the setting of the boost voltage is high and the signal VDDlow is also high, i.e., the supply voltage $V_{DD}$ is low (hence the need for the boost voltage), then the output of the NAND gate 29 is high. If the signal delPORn is high, the output of the AND gate 30 is high. When the signal BOOSTdet is high, the output of the NOR gate 31 is low and the output of the inverter 32 is therefore high, i.e., the signal BOOSTok is high.

If the signal setBOOST is low, then the signal BOOSTok is still produced, by means of the signal delPORn, with delay by the POR pulse.

The POR signal is sent on an inputs, together with the signal ATD, to the circuit 11 for determining whether the minimum functionality conditions of the read circuits have been attained.

The circuit 11 receives on inputs the signal PROP for reproducing the propagation on the dummy word line 4 and a signal for reproducing the propagation on the dummy bit line 6, so as to assuredly detect the starting time of correct reading.

The circuit 11 determines the pre-charge signal PCH, which is adapted to determine the end of the pre-charge interval, in correlation with the generation of the POR signal, which determines the timing at which the supply voltage has reached a value that ensures correct reading (thus solving the problem of the first reading of a memory device after power supply start-up, regardless of the rising slope of said power supply), and also in correlation with the signal PROP and with the signal for reproducing propagation along the dummy bit line 6.

After determining a minimum pre-charge interval that is correlated to the characteristics of the devices and to the supply voltage, on the basis of which the signal PCH_RES that indicates interruption of the pre-charge step is generated, and in correlation with the signals ATD, CE, CEn, and RES_EN, the signal indicating the end of the pre-charge step PCH is generated (in the case of the circuit of FIG. 5, which shows the memory circuit for the pre-charge step, the generated signal is the inverted pre-charge signal PCHn).

The signal PCHn is sent to the network 12, which determines the equalization signal EQ that matches the operating conditions of the devices (low voltage, boost voltage, etc.), the real conductivity of the memory cells involved in the reading operation, and the propagations of the signals along the lines of the memory matrix.

The signal EQ is then "modulated" as a function of the actual current conditions of the devices.

In greater detail, the lower the conductivity of the memory cells, the longer the data evaluation time delay and the slower the execution of the evaluation. Vice versa, the higher the conductivity, the earlier the evaluation step and the faster the data capture.

Timing is therefore flexible and linked to the actual propagations of the non-volatile cells in their real context.

At low voltages, therefore, the equalization signal EQ is longer but may be reduced significantly if a boost structure is active in the device and improves the conductivity of the cells by raising the voltage applied to the word lines.

The equalization signal EQ determines, by virtue of its development, the end of the equalization step and is sent in input to the circuit 13 for enabling/disabling the read circuits, to the sense amplifiers 7, and to the circuit 16 for generating the signal Hz.

During this initial step, as shown in FIG. 7, the signal Hz is high to prevent access of the data from the sense amplifiers 7 to the internal bus 19.

The signal WL of FIG. 7 indicates the onset of propagation on the selected word line, and the signal D_WL indicates reproduction of the propagation of the word line, performed by means of the dummy word line 4.

If a memory matrix 1 split into two half-matrices $1_L$ and $1_H$ is used, propagation reproduction occurs asymmetrically in the half-matrix that is opposite to the one in which the actual word line is selected.

The signal SENDn is an additional signal for sending internal data of the memory over the internal bus 19, when the bus is not used by the read circuits meant to read the data of the memory. During this step, SENDn is low.

The signal DIS generated by the circuit 13 during this step is low, so as to enable the read circuits only for the time required for reading, thus limiting to this step alone the corresponding consumption and the biasing of a generic word line. The high state of the signal DIS interrupts all consumption of the read circuits.

The signal DIS remains low (indicating enabling) throughout the period in which the signal EQ is high and the signal Hz is high.

The signal DIS is sent on an input to the cycle end circuit 14 and to the sense amplifiers.

The cycle end circuit 14 generates the signal WL_dis for enabling/disabling row decoding both for the actual word line and for the dummy word line 4.

The dummy lines 4 and 6 have asymmetrical characteristics: they are fast during resetting and instead behave according to native propagations during the activation step. This feature is useful to repeat internal propagations and at the same time to quickly restore the initial conditions without adding further lines.

During this step, therefore, the signal WL_dis is low, enabling decoding.

The signal LOAD H_L is instead the signal for enabling/disabling the loading of the data of the matrix 1 in the output buffers; the signal is still low during this step, preventing the loading of the data in the output buffers 8. In the case of a byte-only module, there is a single control signal, whereas when WORD/BYTE configuration is possible there are two control lines: LOAD H indicates loading of the data of the "high half-word" (half-matrix $1_H$) and the signal LOAD L indicates loading of the data of the "low half-word" (half-matrix $1_L$).

The circuit of FIG. 3 illustrates the generation of the signal Hz in correlation with ATDn and EQ.

The pre-charge signal PCHn is correlated with the propagation of the word line WL and with the pre-charge of the dummy bit line 6, both of which are stimulated at the end of the signal ATD. Therefore, PCHn becomes high only when the propagations on the word and bit lines have reached the working level. At this point, the signal PCHn remains high up to the following pulse of ATD, which indicates a new address transition.

The signal PCHn is generated by the memory circuit for the pre-charge step, shown in FIG. 5.

The signal OUT shown in FIG. 7 determines the switching of the output buffers 8 as a consequence of the loading of the data therein; this loading, as shown, is timed by the signal LOAD H_L.

Therefore, when the signals on the word line have propagated, when the signal EQ becomes low, the signal Hz becomes low (enabling access to the internal bus 19 on the part of the data of the memory), the signal DIS becomes high, and the signal WL-dis also becomes high to disable decoding; then the signal LOAD H_L undergoes a very short pulsed transition that corresponds to the transit and storage time of the data in the output buffers 8.

The generation of the signal WL_dis is shown in FIG. 6 in correlation with the signals ATD, CE, PCHn, ATDn, and EQ.

Storage of the data in the output buffers 8 then allows to disconnect said output buffers from the rest of the circuit (returning the signal LOAD L_H to a low value and disabling the output buffers by means of the low signal OE), so as to prevent noise from causing unwanted switchings of the output buffers, thus corrupting the data.

The signal END_cycle switches to the high level simultaneously with the switching of the signals DIS, WL_dis, and LOAD H_L to the high level, determining the end of the read cycle and thus also the end of the consumptions of the read paths (including the boost voltage).

Let us now consider the case in which there are two very close pulses of ATD, as shown in FIG. 7.

In this case, the propagation of the word line WL and therefore of the dummy word line 4, D_WL, are interrupted by the arrival of the second pulse of ATD before the propagations can occur completely.

If the propagations are incomplete, the signals PCHn and EQ, correlated to the propagations, do not switch to the high and low levels respectively, but extend their duration and then switch when full propagations are actually achieved.

In these contexts, the "fast reset" feature of the dummy lines 4 and 6 is advantageous. Therefore, an incomplete read cycle does not allow to update the content of the output buffers 8, since the signal LOAD H_L is generated only when EQ and Hz switch to the low level.

The modulation of the start time (i.e, the delay) of the switching of the signal EQ and of the slope of the signal, correlated to the conductivity of the memory cells involved in the reading operation, allows to determine an extremely flexible equalization step.

In this manner, the reading timing is dynamically linked to the operating conditions, to the conductivity and to the characteristics of the devices determined by the technology that is used.

The signals Hz, DIS, LOAD H_L, WL_dis, and OUT are correlated to the development of the equalization signal EQ.

FIGS. 8 and 9 are useful in showing the developments of the signals that are present in the architecture according to the invention. In particular, it can be seen that as the supply voltage $V_{DD}$ rises, in the case of no boost voltage (FIG. 8), the developments of the signals are determined on the chart by the solid lines. If the boost voltage is present, instead (FIG. 9), the developments of the signals are shifted (i.e., the dashed lines now show the development in case of no boost voltage and the solid lines indicate development in case of boost voltage), since the reading timing waits for trip point attainment, referenced by TRIP-POINT, to indicate the attainment of a minimum preset threshold on the part of the boost voltage; at this point reading can be performed.

Accordingly, these two charts show the flexibility of the reading timing as a function of the level of the supply voltage.

In practice it has been observed that the memory architecture according to the invention fully achieves the intended aim, since it allows to perform correct reading in synchronization with the events of the read circuits.

In particular, the architecture according to the invention allows to correctly read the data item even in power supply start-up conditions, i.e., from the very start; in other words, when the power supply has not yet reached its steady-state value.

The reading achieved with the architecture according to the invention is highly immune to noise, due to the fact that only the actually completed and therefore authentic reading cycles cause switching of the output buffers 8, modifying the data in output.

The memory device has time-controlled event management, and this entails synchronization among the various internal circuits and with the essential propagations of the signals within the memory, thus providing a flexible reading timing that is dynamically adapted to the characteristics of the internal circuits determined by the technology that is used and by the power supply values that are present for the device (voltage $V_{DD}$ or boost voltage).

The consumptions of the memory device are minimized, since activation of the memory circuits is limited only to the step for extracting the data item to be read, at the same time ensuring greater reliability of the memory device, since static biasings within the device are eliminated.

In particular, end-of-cycle deselection of the row decoders 3 allows to interrupt all tapping of current from the boost line, improving memory performance and avoiding useless overloads. Furthermore, this approach allows to completely eliminate consumptions at zero frequency and in any case provides a correlation that is directly proportional to the frequency.

The output buffers 8, being substantially immune to noise, can be given large dimensions, with the advantage of reducing the output switching times and therefore providing faster memory reading.

The matching of the read timing with the characteristics of the read circuits, with the power supply and temperature conditions, and with the actual propagations of the signals along the lines (determining delays that are not predefined and static but are "dynamic") allows to optimize read times, at the same time always ensuring correct reading of the data of the memory.

Numerous modifications and variations can be made to the above-described embodiments, all of which are intended to be within the scope of the invention. Furthermore, some elements may be replaced with other technically equivalent elements.

In practice, the materials employed, so long as they are compatible with the specific use, as well as the dimensions, may be any according to the requirements and the state of the art.

Where technical features mentioned in any claim are followed by reference signs, those reference signs have been included for the sole purpose of increasing the intelligibility of the claims and accordingly such reference signs do not have any limiting effect on the interpretation of each element identified by way of example by such reference signs.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. A memory circuit for flexible reading management, comprising:
   at least one memory matrix having word lines;
   at least one sense amplifier for capturing data from said at least one memory matrix;
   at least one output buffer for providing the data as an output;
   an internal bus connecting said output buffer and said sense amplifier;
   at least one row decoder for selecting the word lines of said memory matrix;
   a memory read address transition detection circuit adapted to produce an address transition signal;
   a circuit for enabling/disabling read circuits;
   a circuit for enabling a reading process, adapted to enable the reading process only after minimum functionality levels of memory cells involved in the reading process and of all the read circuits have been reached;
   a determining circuit for determining whether a preset threshold level has been reached by a boost supply voltage, said determining circuit being adapted to compare said boost voltage to said preset threshold level and to emit a confirming signal for confirming attainment of the preset threshold level by said boost voltage, said confirming signal being sent on an input to said circuit for enabling the reading process;
   a propagation reproduction circuit;
   a network for equalizing and correlating the reading process with respect to characteristics of the circuits, signal propagations, and conductivity of the memory cells, said propagations being detected by the propagation reproduction circuit;
   a reading cycle end circuit, adapted to determine an end of the reading process by deactivating said row decoder following a capture of the data in said sense amplifier; and
   a circuit for synchronized and time-limited loading of the data in said at least one output buffer, said output buffer having a memory structure and being normally disconnected from the circuits, said enabling of the reading process being performed in close correlation with intrinsic characteristics of the circuits and of the memory cells.

2. The memory circuit of claim 1, wherein said propagation reproduction circuit includes:
   a dummy word line and a dummy bit line, which are respectively identical to a generic word line and to a generic bit line of the memory matrix, in order to reproduce the propagation times of the signals along said lines.

3. The memory circuit of claim 1, wherein said address transition signal is sent on a first input to said circuit for enabling/disabling, on a second input to said circuit for enabling the reading process, and on a third input to said reading cycle end circuit.

4. The memory circuit of claim 1, further comprising:
   a circuit for activation of said at least one output buffer that is adapted to activate said output buffer only simultaneously with a first read data item.

5. The memory circuit of claim 1, wherein the circuit for enabling the reading process includes:
   a circuit for generating a power-on-reset signal that is adapted to determine when a boost supply voltage reaches a minimum level that is adapted to ensure correct data reading, said power-on-reset signal being generated as a function of a conductivity of a sample memory cell that is identical to a generic matrix cell.

6. The memory circuit of claim 5, wherein the circuit for enabling the reading process further includes:

a circuit for reproducing selection/deselection and pre-charge delays of a generic bit line and a circuit for determining an attainment of a working point of a bit line involved in the reading process, adapted to emit a signal for indicating interruption of the pre-charge step for said bit line, so as to determine a minimum but flexible pre-charge interval that is correlated with the characteristics of the circuits, said pre-charge interruption signal being sent on an input to said network for equalization and correlation of the reading process with respect to the characteristics of the circuits and to a supply voltage value that is actually present.

7. The memory circuit of claim 1, wherein said network for equalization and correlation of the reading process with respect to the characteristics of the circuits is adapted to emit an equalization signal, whose generation delay and slope are modulated according to the conductivity of a memory cell that is identical to a generic matrix cell and with the same biasing conditions, said equalization signal being sent in input to said circuit for enabling/disabling the read circuits.

8. The memory circuit of claim 7, wherein said circuit for the synchronized loading of the data in said at least one output buffer receives in input said equalization signal and said address transition signal, in order to generate a signal for loading the data in said at least one output buffer, after transmission over said internal bus, said synchronized data loading being provided for a minimum time interval that is sufficient for transit and capture of the data in the memory structure of said output buffer.

9. The memory circuit of claim 1, wherein the at least one memory matrix includes two memory half-matrices and two row decoders, one for each half-matrix.

10. The memory circuit of claim 9, wherein at least one output buffer is provided for each one of said two memory half-matrices.

11. The memory circuit of claim 10, wherein said circuit for the synchronized and time-limited loading of the data in said output buffers has means for selecting the loading of the data that arrive from one of said two memory half-matrices and the other.

12. The memory circuit of claim 1, wherein said row decoder is a hierarchical decoder.

13. A method for reading data of a memory device that includes at least one memory matrix; at least one sense amplifier for capturing the data from said at least one memory matrix; at least one output buffer for providing the read data in output, said buffer being connected to said sense amplifier by means for an internal bus; and at least one row decoder for selecting the word lines of said memory matrix; the method comprising the steps of:

selecting a row of the memory matrix that corresponds to a read address and generating a read address transition detection signal for a synchronization of read circuits;

determining when conditions of minimum functionality for the read circuits, for memory cells to be read, and for a supply voltage are attained, comprising determining when a boost voltage reaches a preset minimum threshold level by comparing the boost voltage to the preset minimum threshold level;

enabling the read circuits exclusively for a reading step;

capturing the data of the memory matrix in said at least one sense amplifier; and sending said data to said at least one output buffer, synchronously with an arrival of the data, to provide the data as an output.

14. The method of claim 13, further comprising a step of:

determining when a boost voltage reaches a preset minimum threshold level, in order to trigger a reading process.

15. The method of claim 13, further comprising a step of:

enabling said at least one output buffer only simultaneously with a first read data item.

16. The method of claim 13, wherein the step of determining when conditions of minimum functionality for the read circuits, for memory cells to be read, and for the supply voltage are attained, includes a step of:

reproducing propagations of word lines and bit lines selected in said memory matrix in order to reproduce their delays, detect an attainment of a minimum supply voltage level to perform correct reading of the data of the matrix, and generate an equalization signal that is correlated to a conductivity of the memory cells to be read, to the propagations, and to an operating voltage.

17. The method of claim 13, wherein the step of capturing the data in the sense amplifier is performed simultaneously with a step of deactivating the row decoder to limit consumptions of the memory device.

18. The method of claim 13, wherein the step of sending said data to said at least one output buffer includes a step of loading said data in the output buffer synchronously with an arrival of the data and for a time interval that is sufficient for a transit and capture of the data in said output buffer.

19. The method of claim 13, further comprising a step of:

disconnecting said output buffer from the other read circuits following a loading of the data within said output buffer, a content of the output buffer being updated only at the end of a complete reading cycle.

20. A memory circuit for flexible reading management, comprising:

at least one memory matrix having word lines;

at least one sense amplifier for capturing data from said at least one memory matrix;

at least one output buffer for providing the data as an output;

an internal bus connecting said output buffer and said sense amplifier;

at least one row decoder for selecting the word lines of said memory matrix;

a memory read address transition detection circuit adapted to produce and address transition signal;

means for enabling/disabling read circuits;

means for enabling a reading process, adapted to enable the reading process only after minimum functionally levels of memory cells involved in the reading process and of all read circuits have been reached;

determining means for determining whether a preset threshold level has been reached by a boost supply voltage, said determining means being adapted to compare said boost voltage to said preset threshold level and to emit a confirming signal for confirming attainment of the preset threshold level by said boost voltage, said confirming signal being sent on an input to said means for enabling the reading process:

a propagation reproduction circuit;

means for equaling and correlating the reading process with respect to characteristics of the circuits, signal propagations, and conductivity of the memory cells, said propagations being detected by the propagation reproduction circuit;

a reading cycle end circuit, adapted to determine an end of the reading process by deactivating said row decoder following a capture of the data in said sense amplifier; and means for synchronized and time-limited loading of the data in said at least one output buffer, said output buffer having a memory structure and being normally disconnected from the circuits, said enabling of the reading process being performed in close correlation with intrinsic characteristics of the circuits and of the memory cells.

* * * * *

UNITED STATES PATENT AND TRADEMARK OFFICE
CERTIFICATE OF CORRECTION

PATENT NO. : 5,917,768
DATED : June 29, 1999
INVENTOR(S) : Luigi Pascucci

It is certified that error appears in the above-identified patent and that said Letters Patent is hereby corrected as shown below:

On the title page, item [54] and col. 1, should read as follows:

MEMORY ARCHITECTURE FOR FLEXIBLE READING MANAGEMENT, PARTICULARLY FOR NON-VOLATILE MEMORIES, HAVING NOISE-IMMUNITY FEATURES, MATCHING DEVICE PERFORMANCE, AND HAVING OPTIMIZED THROUGHPUT

Signed and Sealed this

Third Day of October, 2000

Attest:

Q. TODD DICKINSON

*Attesting Officer*           *Director of Patents and Trademarks*